(12) United States Patent
Namba et al.

(10) Patent No.: US 11,433,608 B2
(45) Date of Patent: Sep. 6, 2022

(54) IMPRINT APPARATUS AND METHOD OF CONTROLLING IMPRINT APPARATUS

(71) Applicant: CANON KABUSHIKI KAISHA, Tokyo (JP)

(72) Inventors: Hisashi Namba, Utsunomiya (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 17/012,265

(22) Filed: Sep. 4, 2020

(65) Prior Publication Data

US 2021/0069976 A1 Mar. 11, 2021

(30) Foreign Application Priority Data

Sep. 11, 2019 (JP) .............................. JP2019-165641

(51) Int. Cl.
*B29C 64/227* (2017.01)
*B29C 64/112* (2017.01)
(Continued)

(52) U.S. Cl.
CPC .......... *B29C 64/227* (2017.08); *B29C 64/112* (2017.08); *B29C 64/209* (2017.08);
(Continued)

(58) Field of Classification Search
CPC ... B29C 64/227; B29C 64/112; B29C 64/209; B41J 2/04573; B41J 2/04581;
(Continued)

(56) References Cited

U.S. PATENT DOCUMENTS 9,834,002 B2   12/2017   Araki et al.
10,118,317 B2  11/2018   Kawamura et al.
(Continued)

FOREIGN PATENT DOCUMENTS

CN   108340680   *  7/2018
JP   2016-225370 A   12/2016
(Continued)

OTHER PUBLICATIONS

Kawahara et al., U.S. Appl. No. 16/766,384, filed May 22, 2020.
Iimura et al., U.S. Appl. No. 17/012,279, filed Sep. 4, 2020.
Namba et al., U.S. Appl. No. 17/012,287, filed Sep. 4, 2020.

*Primary Examiner* — Caleen O Sullivan
(74) *Attorney, Agent, or Firm* — Venable LLP

(57) ABSTRACT

An imprint apparatus includes: a substrate stage configured to move a substrate; an ejection unit including a plurality of nozzles and configured to eject an ejection material from the nozzles onto the substrate in synchronization with movement of the substrate stage; and a mold driving mechanism configured to drive a mold on which a pattern is formed to press down the mold onto the substrate. The imprint apparatus determines a relative ejection timing of an abnormal nozzle with respect to a normal nozzle based on ejection properties of the nozzles and a moving direction of the substrate stage, determines an ejection timing of the normal nozzle based on the determined relative ejection timing, and controls a synchronization timing of the substrate stage and the ejection unit based on the determined ejection timing of the normal nozzle.

13 Claims, 10 Drawing Sheets

(51) Int. Cl.
*B29C 64/209* (2017.01)
*B41J 2/045* (2006.01)
*B41J 3/54* (2006.01)
*G03F 7/00* (2006.01)
*B29L 31/34* (2006.01)

(52) U.S. Cl.
CPC ....... *B41J 2/04573* (2013.01); *B41J 2/04581* (2013.01); *B41J 3/543* (2013.01); *G03F 7/0002* (2013.01); *B29L 2031/34* (2013.01)

(58) Field of Classification Search
CPC ...... B41J 3/543; B41J 2/04505; B41J 2/0451; B41J 2/2135; B41J 3/407; B41J 11/42; B41J 29/38; G03F 7/0002; G03F 7/161; G03F 7/70716; G03F 9/7042; B29L 2031/34; B33Y 30/00
USPC ................. 438/700; 425/174; 347/7; 355/18
See application file for complete search history.

(56) References Cited

U.S. PATENT DOCUMENTS

| 10,518,546 | B2 | 12/2019 | Araki et al. |
| 2012/0207931 | A1* | 8/2012 | Ota ................. G03F 7/0002 118/712 |
| 2013/0050336 | A1* | 2/2013 | Muto ................. C09D 11/36 347/105 |
| 2020/0338806 | A1 | 10/2020 | Kawahara et al. |
| 2020/0341369 | A1 | 10/2020 | Namba et al. |
| 2020/0376851 | A1 | 12/2020 | Kuri et al. |

FOREIGN PATENT DOCUMENTS

| JP | 2018-075819 A | 5/2018 |
| WO | 2019/107383 A1 | 6/2019 |

* cited by examiner

OUTWARD ROUTE

RETURN ROUTE

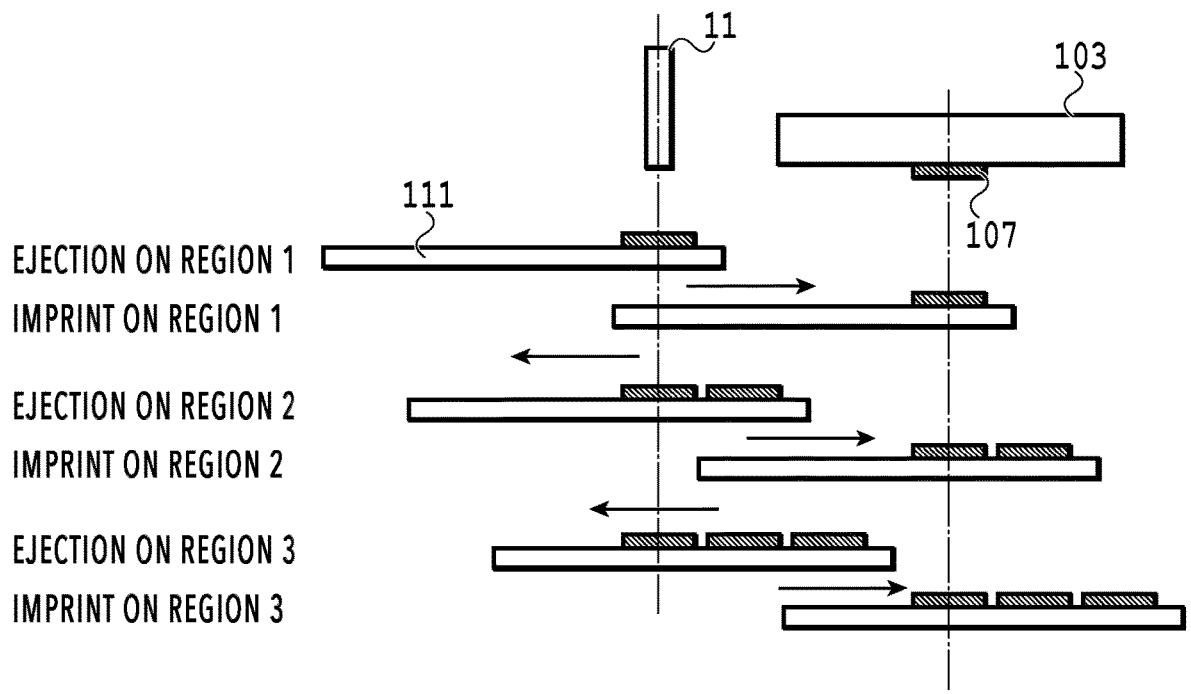
FIG.10A
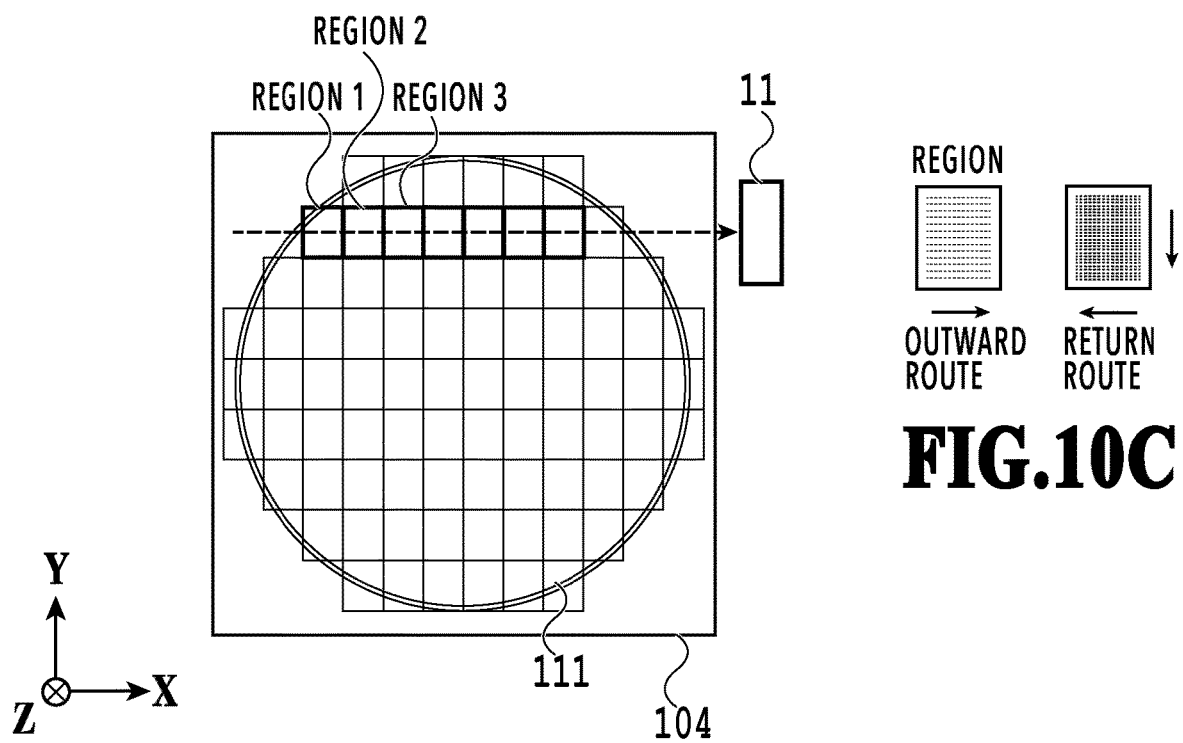
FIG.10B
FIG.10C

IMPRINT APPARATUS AND METHOD OF CONTROLLING IMPRINT APPARATUS

BACKGROUND OF THE INVENTION

Field of the Invention

The present invention relates to an imprint apparatus and a method of controlling the imprint apparatus.

Description of the Related Art

There has been known an imprint apparatus that forms a fine structure in the order of a few nano meters on a substrate. In the imprint apparatus, an uncured resin is ejected and applied as liquid droplets onto the substrate by multiple nozzles provided in an ejection unit (dispenser). Next, a mold in which a pattern is carved is pressed against the substrate on which the resin is applied, so that the resin is shaped. Then, after the resin is cured with irradiation with ultraviolet rays, the mold is detached and thus the pattern of the resin is formed on the substrate.

The ejection unit in such an imprint apparatus is required to achieve landing accuracy in the ejection of the resin onto the substrate. For example, there is a problem that the yield of a semiconductor chip is decreased because the resin reaches a side surface of the mold during the imprinting and then is peeled off (Japanese Patent Laid-Open No. 2016-225370). For this reason, the high landing accuracy in the ejection of the resin onto the substrate is required.

Japanese Patent Laid-Open No. 2018-75819 discloses a technique of shifting the timing of the ejection in the inkjet apparatus to prevent a local unevenness or streak.

In the case of the ejection unit in the imprint apparatus, a region in which the ejection timing can be shifted may be too small to make sufficient correction in some cases.

SUMMARY OF THE INVENTION

An imprint apparatus according to an aspect of the present invention includes: a substrate stage configured to move a substrate; an ejection unit including multiple nozzles and configured to eject an ejection material from the nozzles onto the substrate in synchronization with movement of the substrate stage; and an imprint unit configured to press down a mold on which a pattern is formed onto the substrate on which the ejection material is ejected. The imprint apparatus includes: a determination unit configured to determine a relative ejection timing of an abnormal nozzle with respect to a normal nozzle based on ejection properties of the nozzles and a moving direction of the substrate stage and determine an ejection timing of the normal nozzle based on the determined relative ejection timing; and a control unit configured to control a synchronization timing of the substrate stage and the ejection unit based on the ejection timing of the normal nozzle determined by the determination unit.

Further features of the present invention will become apparent from the following description of exemplary embodiments with reference to the attached drawings.

BRIEF DESCRIPTION OF THE DRAWINGS

FIGS. 10A to 10C are diagrams describing states during the reciprocation.

DESCRIPTION OF THE EMBODIMENTS

Figure 1:
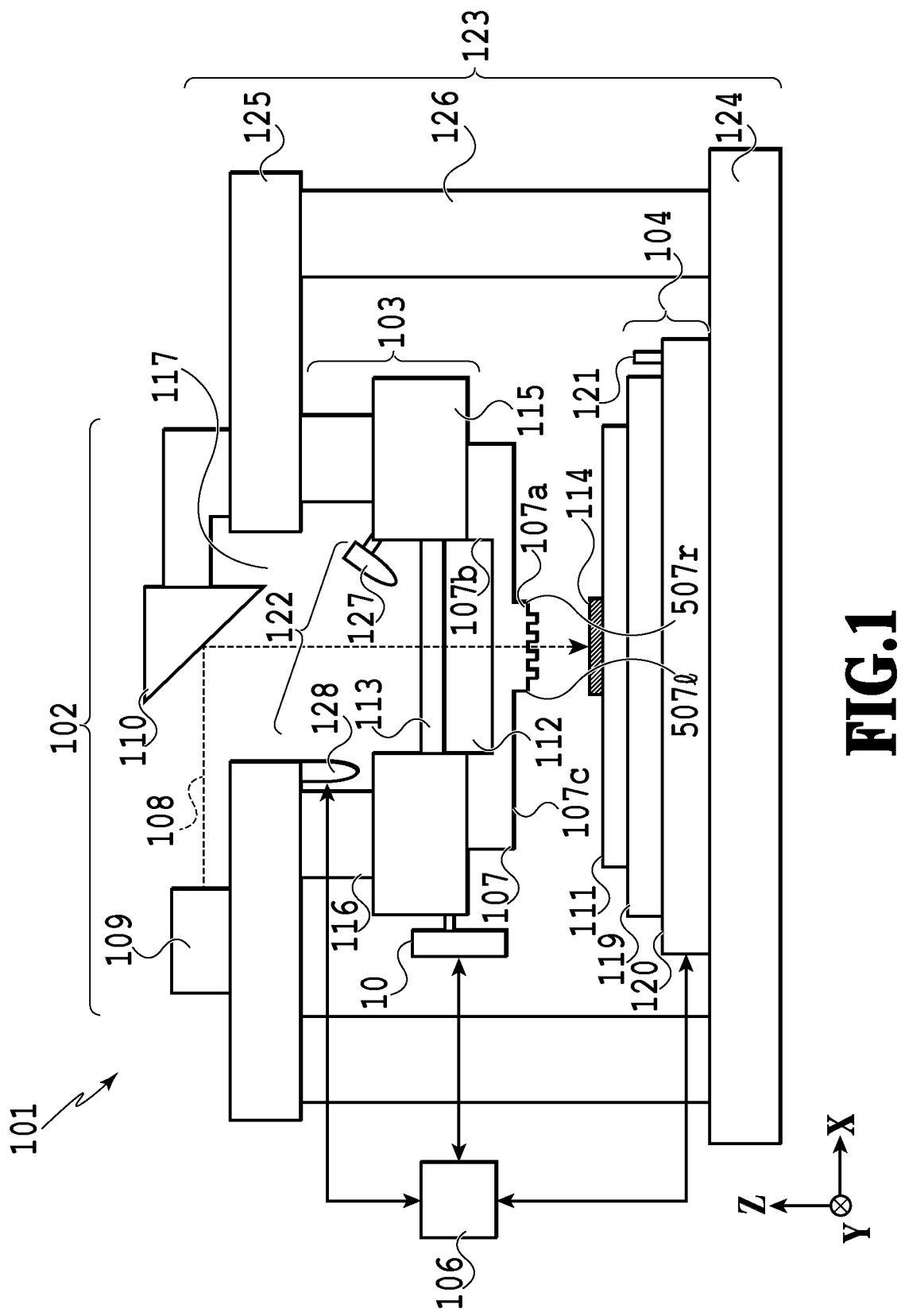
FIG. 1 is a schematic diagram of an imprint apparatus.

Hereinafter, embodiments are described with reference to the drawings. The same configurations are described with the same reference numerals assigned thereto. The relative arrangement, shapes, and the like of the constituents described in the embodiments are merely examples.

First Embodiment

<Imprint Apparatus>

FIG. 1 is a schematic diagram illustrating a configuration of an imprint apparatus 101 applicable to the present embodiment. The imprint apparatus 101 is used in manufacture of various devices including a semiconductor device. The imprint apparatus 101 includes an ejection device 10. The ejection device 10 ejects an ejection material 114 (resist) on a substrate 111. The ejection material 114 is a photocurable resin having properties of curing by receiving ultraviolet rays 108. The ejection material 114 is arbitrarily selected depending on various conditions such as the semiconductor device manufacture steps. For example, other than the photocurable one, a thermosetting resist may be used as the ejection material, and the imprint apparatus may be an apparatus that performs the imprint processing by curing the resist by heat. The ejection material 114 may be called an imprint material.

The imprint apparatus 101 performs the imprint processing including the following series of processing. Specifically, the imprint apparatus 101 causes the ejection device 10 to eject the ejection material 114 on the substrate 111. Then, a mold 107 including a pattern for molding is impressed on the ejection material 114 ejected on the substrate 111, and the ejection material 114 is cured by being irradiated with light (ultraviolet rays) with the mold 107 impressed. Thereafter, the mold 107 is pulled away from the cured ejection material 114, and thus the pattern of the mold 107 is transferred on the substrate 111.

The imprint apparatus 101 includes a light irradiation unit 102, a mold holding mechanism 103, a substrate stage 104, the ejection device 10, a control unit 106, a measuring unit 122, and a housing 123.

The light irradiation unit 102 includes a light source 109 and an optical element 110 that corrects the ultraviolet rays 108 radiated from the light source 109. The light source 109 is a halogen lamp that generates i-line or g-line, for example. The ultraviolet rays 108 are radiated to the ejection material 114 through the mold 107. The wavelength of the ultraviolet rays 108 is a wavelength depending on the ejection material 114 to be cured. In the case where the imprint apparatus uses the thermosetting resist as the resist, a heat source unit for curing the thermosetting resist is provided instead of the light irradiation unit 102.

The mold holding mechanism 103 includes a mold chuck 115 and a mold driving mechanism 116. The mold 107 held by the mold holding mechanism 103 has a rectangular circumference, and a surface facing the substrate 111 includes a mesa 107a in which a three-dimensional bumpy pattern such as a circuit pattern to be transferred is formed. The material of the mold 107 in the present embodiment is a material that allows the ultraviolet rays 108 to penetrate therethrough, and a quartz may be used, for example.

The mold chuck 115 holds the mold 107 by vacuum sucking or electrostatic force. The mold driving mechanism 116 moves while holding the mold chuck 115 to move the mold 107. The mold driving mechanism 116 can impress the mold 107 to the ejection material 114 by moving the mold 107 in the −Z direction. The mold driving mechanism 116 can pull away the mold 107 from the ejection material 114 by moving the mold 107 in the +Z direction. A linear motor or an air cylinder may be used as an actuator adoptable in the mold driving mechanism 116, for example.

The mold chuck 115 and the mold driving mechanism 116 each include an opening region 117 in the center. The mold 107 includes a concaved cavity 107b on a surface to be irradiated with the ultraviolet rays 108. The opening region 117 of the mold driving mechanism 116 is provided with a light transmissive member 113, and a closed space 112 surrounded by the light transmissive member 113, the cavity 107b, and the opening region 117 is formed. The pressure in the space 112 is controlled by a pressure correction device (not illustrated). The pressure correction device sets the pressure in the space 112 higher than the pressure outside to cause the mesa 107a to bend to be convex toward the substrate 111. Accordingly, the center of the mesa 107a comes in contact with the ejection material 114. Consequently, it is possible to inhibit gas (air) from being captured between the mesa 107a and the ejection material 114 while the mold 107 is impressed to the ejection material 114 and to fill the bumpy portions of the mesa 107a completely with the ejection material 114. The depth of the cavity 107b that determines the size of the space 112 is arbitrarily changed depending on the size or the material of the mold 107.

The mold 107 includes a mesa 107a on which a bumpy pattern is formed and an off-mesa surface 107c as a region other than the mesa 107a, and the mesa 107a projects from the off-mesa surface 107c in the −Z direction by several tens μm. The mold 107 and the mold driving mechanism 116 are an imprint unit that presses the mesa 107a of the mold 107 downward to the substrate.

The substrate stage 104 includes a substrate chuck 119, a substrate stage housing 120, and a stage reference mark 121. The substrate 111 held by the substrate stage is a single crystal silicon substrate or a silicon on insulator (SOI) substrate, and the ejection material 114 is ejected on a processed surface of the substrate 111 to form the pattern.

The substrate chuck 119 holds the substrate 111 by vacuum sucking. The substrate stage housing 120 moves in the X direction and the Y direction while holding the substrate chuck 119 by a mechanical unit to move the substrate 111. The stage reference mark 121 is used to set a reference position of the substrate 111 during alignment of the substrate 111 and the mold 107.

A linear motor may be used as an actuator of the substrate stage housing 120, for example. Otherwise, the actuator of the substrate stage housing 120 may have a configuration including multiple driving systems such as a coarse motion driving system and a slight motion driving system.

The ejection device 10 ejects the uncured ejection material 114 in the liquid form from a nozzle and applies the ejection material 114 on the substrate 111. In the present embodiment, a method of pressing out the ejection material 114 from an ejection port by using the piezoelectric effect of a piezoelectric element is adopted. The later-described control unit 106 generates a driving waveform for driving the piezoelectric element and applies the driving waveform to the piezoelectric element to drive the piezoelectric element such that the piezoelectric element is deformed into a shape proper for the ejection. Multiple nozzles that are independently controllable are provided. The amount of the ejection material 114 ejected from the nozzles of the ejection device 10 is arbitrarily determined depending on the desired thickness of the ejection material 114 to be formed on the substrate 111 or the density of the pattern to be formed.

The measuring unit 122 includes an alignment measuring instrument 127 and an observation measuring instrument 128. The alignment measuring instrument 127 measures position displacement in the X direction and the Y direction between an alignment mark formed on the substrate 111 and an alignment mark formed on the mold 107. The observation measuring instrument 128 is an image capturing device such as a CCD camera, for example, and the observation measuring instrument 128 captures an image of the pattern of the ejection material 114 ejected on the substrate 111 and outputs the image to the control unit 106 as image information.

The control unit 106 controls operations of the constituents of the imprint apparatus 101. The control unit 106 includes a computer including a CPU, a ROM, and a RAM, for example. The control unit 106 is connected to the constituents of the imprint apparatus 101 through lines, and the CPU controls the constituents according to control programs stored in the ROM.

Based on the information measured by the measuring unit 122, the control unit 106 controls the operations of the mold holding mechanism 103, the substrate stage 104, and the ejection device 10. The control unit 106 may be formed integrally with another part of the imprint apparatus 101 or may be implemented as a different device separated from the imprint apparatus. The control unit 106 may be formed of multiple computers instead of a single computer.

The housing 123 includes a base surface plate 124 on which the substrate stage 104 is placed, a bridge surface plate 125 to which the mold holding mechanism 103 is fixed, and a post 126 extending from the base surface plate 124 to support the bridge surface plate 125.

The imprint apparatus 101 includes a mold transport mechanism (not illustrated) that transports the mold 107 from the outside of the apparatus to the mold holding mechanism 103 and a substrate transport mechanism (not illustrated) that transports the substrate 111 from the outside of the apparatus to the substrate stage 104.

<Ejection Unit>

Figure 2:
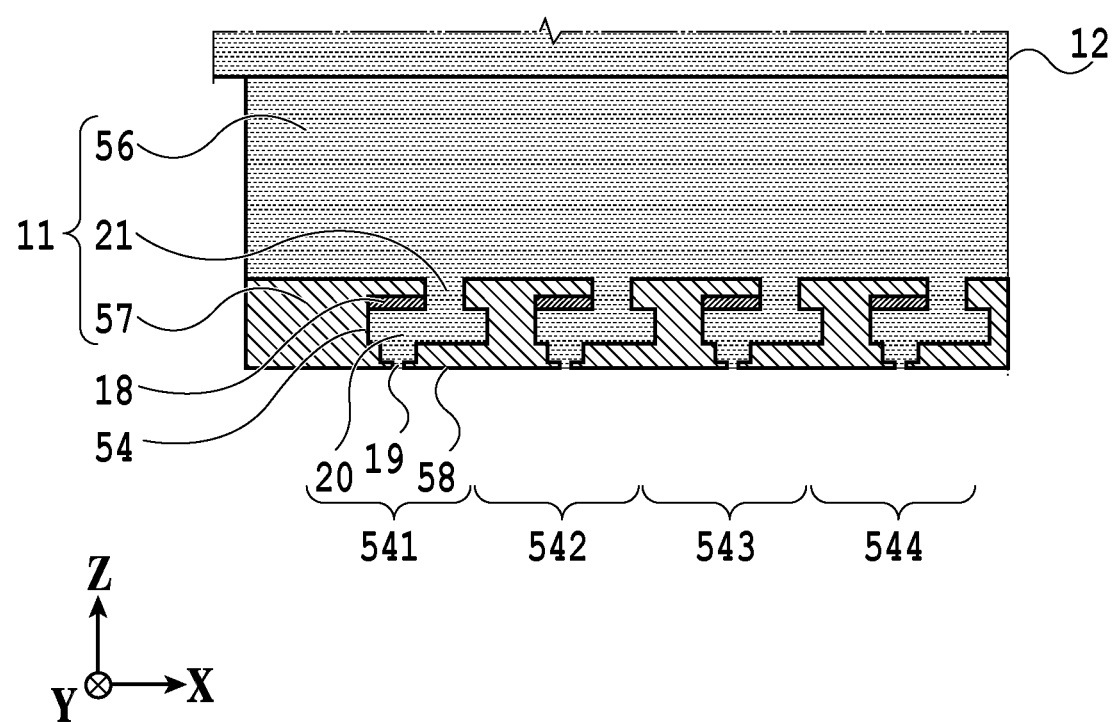
FIG. 2 is an enlarged cross-sectional view of a part of an ejection device.

FIG. 2 is an enlarged cross-sectional view of a part of the ejection device 10 of the present embodiment. The ejection device 10 includes an ejection unit 11 (ejection head) and a storing container 12 capable of storing the ejection material 114. The ejection unit 11 includes a common liquid chamber 56 and a module substrate 57. In the module substrate 57, there are arranged multiple nozzles 54 each including a supply port 21 that supplies the module substrate 57 with the ejection material 114 from the common liquid chamber 56 and the ejection port 19 capable of ejecting the ejection material 114. Each nozzle 54 is provided with a pressure chamber 20 and a piezoelectric element 18 as an energy generation element provided inside the nozzle 54 and that generates energy for ejecting the ejection material 114. The multiple nozzles 54 are indicated as nozzles 541, 542, 543, and 544. The nozzles 54 are arranged to be aligned in the X direction and the Y direction.

The piezoelectric element 18 is used as the energy generation element since the ejection material 114 to be used in the present embodiment contains a lot of resin. The liquid-repellent processing is applied to a surface 58 including the ejection port. The opening area of the ejection port 19 is smaller than the opening area of the supply port 21, and the cross-sectional area thereof is the smallest in a channel in the nozzle 54.

The supply port 21 communicates with the ejection port 19 in the module substrate 57. The ejection material 114 supplied from the supply port 21 to the inside of a nozzle between the piezoelectric element 18 and the ejection port 19 (pressure chamber 20) is ejected on the substrate 111 from the ejection port 19 with the control unit 106 driving the piezoelectric element 18. The ejection unit 11 is preferably an ejection head used in an inkjet head or the like.

Figure 3:
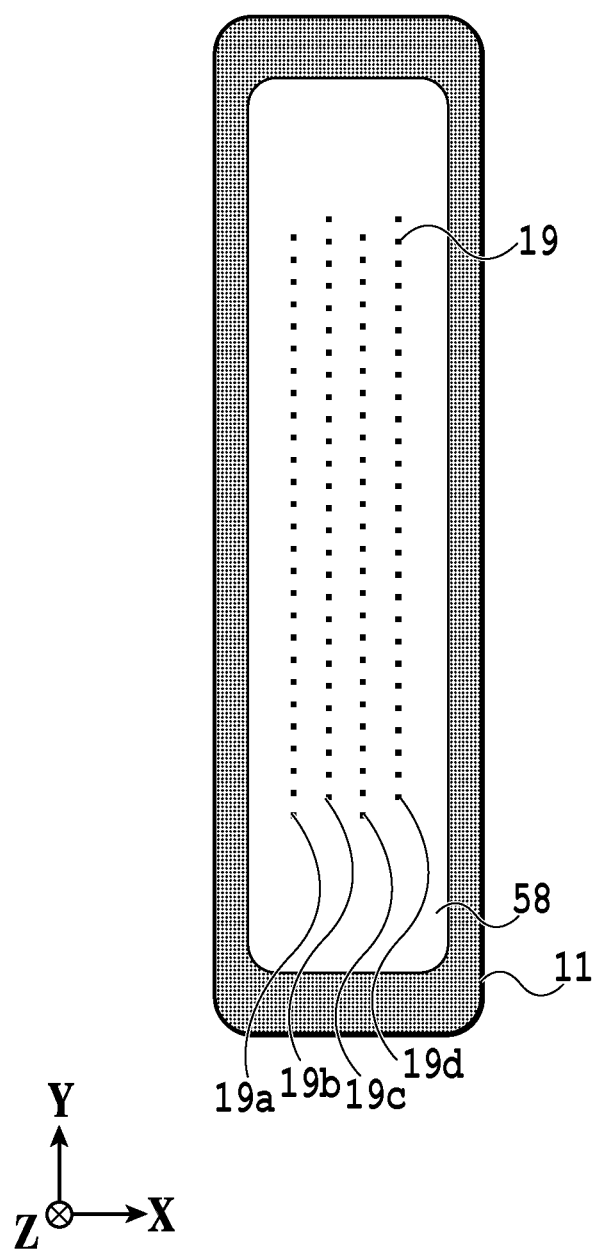
FIG. 3 is a diagram of an ejection unit viewed from a side of a surface including ejection ports.
Figure 4:
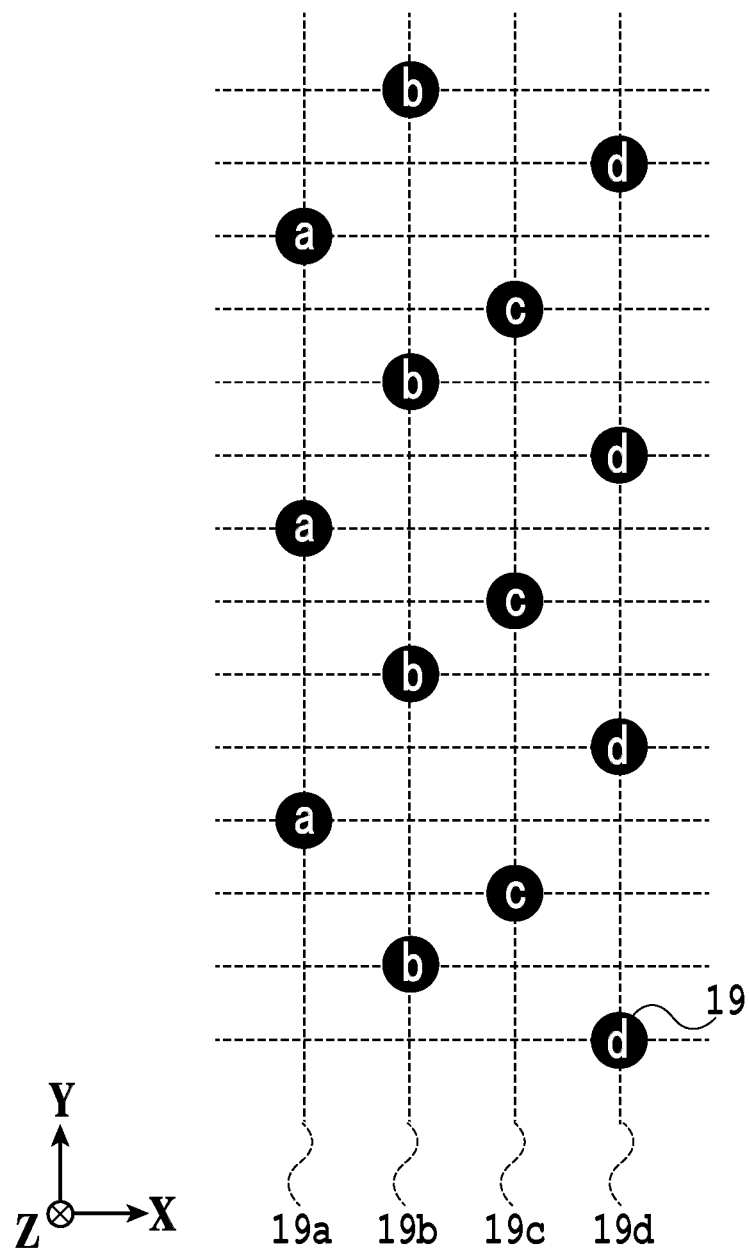
FIG. 4 is a conceptual diagram illustrating a positional relationship of the ejection ports.

FIG. 3 is a diagram of the ejection unit 11 viewed from a side of the surfaces 58 including the ejection ports. FIG. 4 is a conceptual diagram illustrating an enlarged part of the ejection unit 11 in FIG. 3 to show a positional relationship of the ejection ports 19. As illustrated in FIGS. 3 and 4, the multiple ejection ports 19 are arranged in the X direction and the Y direction to be staggered in the ejection unit 11. More specifically, multiple (four in this example) ejection port rows (nozzle rows) 19a to 19d each including the multiple ejection ports 19 arranged in the Y direction are arranged in the X direction. The ejection ports 19 in the same row are arranged at regular intervals. Adjacent ejection port rows are also arranged at regular intervals. As illustrated in FIG. 4, the ejection ports 19 included in the ejection port rows 19a to 19d are provided at positions in which the ejection ports 19 are not overlapped with each other while being viewed from the X direction. The interval between adjacent ejection port rows may be set to, for example, 200 um to 300 um.

<Landing Position Deviation>

In a case where the ejection unit 11 as illustrated in FIG. 3 is used to eject the ejection material 114, the landing position of the ejection material 114 ejected on the substrate 111 from each ejection port 19 may deviate. If the landing position of the ejection material 114 deviates, the following phenomenon may occur while executing the imprinting by pressing down the mold 107.

While the mesa 107a is impressed by lowering the mold 107 to the ejection material 114 ejected on the substrate 111, the ejection material 114 may be spread by a surface tension to be exuded from the mesa 107a and reach a side surface of the mesa 107a. Thereafter, if the ejection material 114 that has reached the side surface of the mesa 107a is cured by the ultraviolet rays 108 as described above, and the cured ejection material 114 is peeled off, the substrate 111 may be affected. Consequently, for example, there may be a case that the yield of the semiconductor chip to be manufactured from the substrate 111 is decreased. Additionally, if the ejection material 114 that has reached the side surface of the mesa 107a and is peeled off, the imprint apparatus 101 needs to be cleaned, and the operating rate is decreased.

Figure 5A:
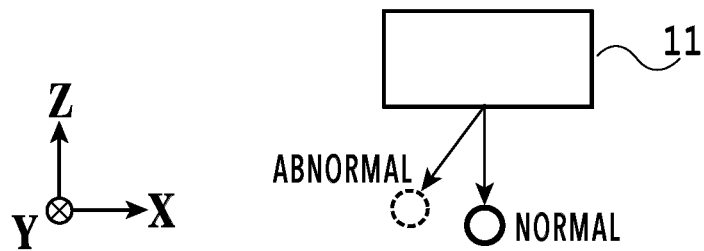
FIGS. 5A and 5B are diagrams describing an ejection port with which a landing position deviates.
Figure 5B:
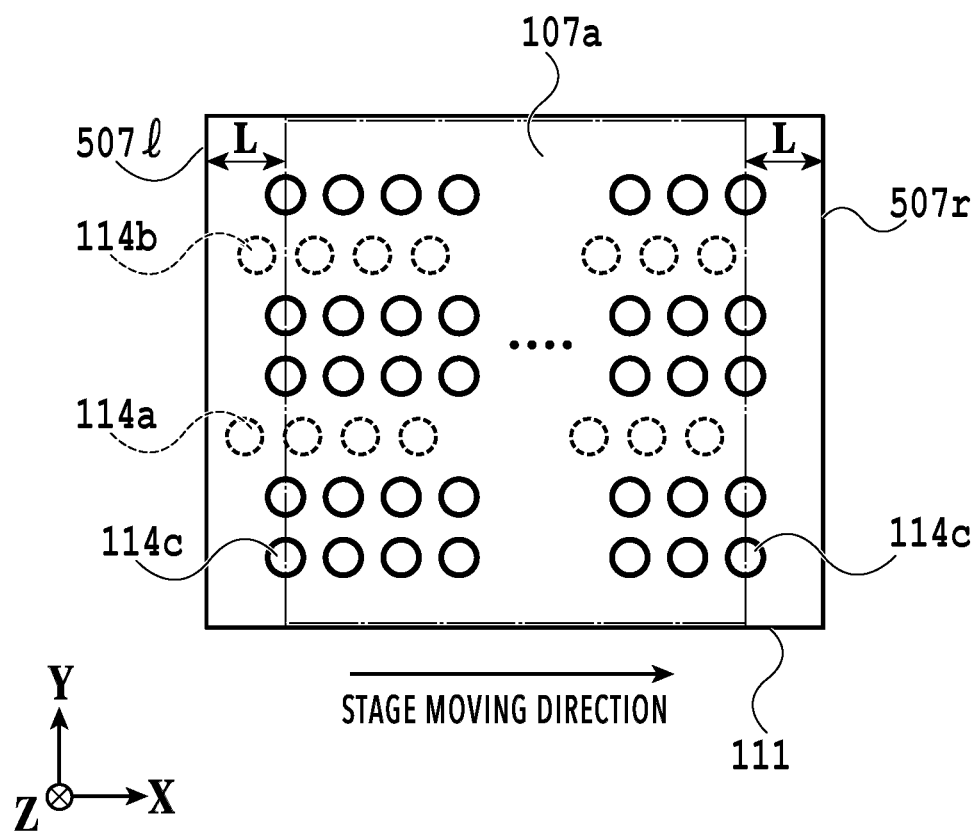

FIGS. 5A and 5B are diagrams describing the ejection port 19 with which the landing position deviates in a case where the ejection material 114 is ejected from one of the ejection port rows (for example, the ejection port row 19a) illustrated in FIG. 3 onto the substrate 111. FIG. 5A illustrates an example of landing on a normal position and an example of landing on a not normal (referred to as abnormal in this example) position in the ejection unit 11. The abnormal position is a position different from a prescribed position. FIG. 5B schematically illustrates the substrate 111 held by the substrate stage 104 and the ejection position of the ejection material 114 ejected from the ejection port 19. FIG. 5B also illustrates a region of a case in which the mesa 107a is pressed onto the substrate 111 by a dashed-dotted line, and the region corresponds to a portion of the mesa 107a on which a pattern is formed. FIG. 5B further illustrates mesa edges 507l and 507r as end portions of the mesa 107a. The ejection material 114 ejected onto the substrate 111 in FIG. 5B indicates the ejection material 114 ejected from a single ejection port row (for example, the ejection port row 19a). Although the ejection material 114 is ejected onto the substrate 111 from the ejection ports of the ejection port rows 19a to 19d, the ejection material 114 illustrated herein is ejected from the single ejection port row 19a for the sake of simple description. The ejection port row 19a extends in a direction (Y direction) crossing the stage moving direction.

In the present embodiment, the ejection device 10 is moved to a predetermined ejection position facing the substrate 111. Thereafter, the ejection device 10 performs the ejection operation while the substrate stage 104 is being moved in the stage moving direction (stage scanning direction, X direction). In this way, the ejection material 114 is ejected to a predetermined region on the substrate 111. That is, the ejection operation by the ejection device 10 and the movement timing of the substrate stage 104 are synchronously controlled.

In this process, as described above, it is required for the ejection material 114 to land on a position in which the ejection material 114 is not exuded from the mesa 107a to inhibit the reaching of the ejection material 114 to the side surface of the mesa 107a. For example, as illustrated in FIG. 5B, it is preferred to set the distance between the mesa edges 507l and 507r and ejection materials 114c respectively landing on the sides of the mesa edges 507l and 507r to a predetermined distance L, ideally. Considering the effect of the deviation of the landing position, it is required to achieve the landing with an accuracy at which the distances between the mesa edges 507l and 507r and the ejection materials 114c respectively landing on the sides of the mesa edges 507l and 507r should be ±10 um or less with respect to the predetermined distance L.

As described above, the movement timing of the substrate stage 104 and the ejection operation of the ejection device 10 are synchronized to eject the ejection material 114 (to apply the resin) onto a desired position on the substrate 111 on the substrate stage 104 from the ejection device 10. The distance between the mesa edge 507r on the side on which the first ejection is performed on the substrate 111 and the ejection material 114c on the mesa edge 507r side is adjusted to the predetermined distance L by adjusting the timing of the synchronization. Additionally, the distance between the mesa edge 507l on the side on which the last ejection is performed and the ejection material 114c on the mesa edge 507l side is adjusted to achieve the accuracy of ±10 um or less with respect to the predetermined distance L by adjusting the number of the ejection clocks.

With the above-described adjustment processing, the ejection material 114 lands on a position in which the ejection material 114 does not exude from the mesa 107a as long as the nozzle performs the normal ejection (hereinafter, referred to as a normal nozzle). However, the actual ejection device 10 may include a nozzle 54 (ejection port 19) in which the ejection angle or the ejection speed is varied in some cases. As described above, since the ejection operation is performed while the substrate stage 104 is moved in the stage moving direction (X direction), the landing position may deviate from the target in the stage moving direction not only if the ejection angle is varied but also if the ejection speed is varied. It is difficult to completely avoid the manufacturing variation in the ejection angle and the ejection speed. For this reason, it is required to correct the deviation of the landing position in the stage moving direction caused by the variation in the ejection angle or the ejection speed. The nozzle that is incapable of performing the normal ejection due to the variation in the ejection angle or the ejection speed is hereinafter called an "abnormal nozzle".

There may be considered a method of shifting the ejection timing as an method of correcting the deviation of the landing position in the stage moving direction. For example, as illustrated in FIG. 5A, here is assumed a case where there is the abnormal nozzle in which the ejection angle deviates rearward in the stage moving direction. In this case, as illustrated in FIG. 5B, the landing positions of ejection materials 114a and 114b ejected from abnormal nozzles deviate rearward in the stage moving direction with respect to the landing position of the ejection material 114c ejected from a normal nozzle. FIG. 5B illustrates an example in which two nozzles 54 in the ejection port row 19a are the abnormal nozzles.

The distance between the mesa edge 507l on the rear side in the stage moving direction of the mesa 107a and the ejection material 114a or the ejection material 114b is shorter than the distance between the mesa edge 507l and the ejection material 114c, which is normally ejected. If the imprinting is performed by pressing the mold 107 in this state, the ejection material 114a and the ejection material 114b are spread beyond the mesa edge 507l, and consequently, the resin exudes to the side surface of the mesa 107a.

In this case, it is possible to correct the deviation of the landing position by making the ejection timing of the abnormal nozzle earlier than the ejection timing of the normal nozzle. Specifically, it is possible to shift the ejection timing by shifting a waveform of a voltage applied to the piezoelectric element 18 for the ejection. Note that, the ejection is performed every 20 us (microsecond) if the ejection is performed at up to 50 KHz. Thus, if a region of the waveform of 20 us or more is secured, the next ejection is started; therefore, the length of the waveform needs to be up to 20 us.

Figure 6:
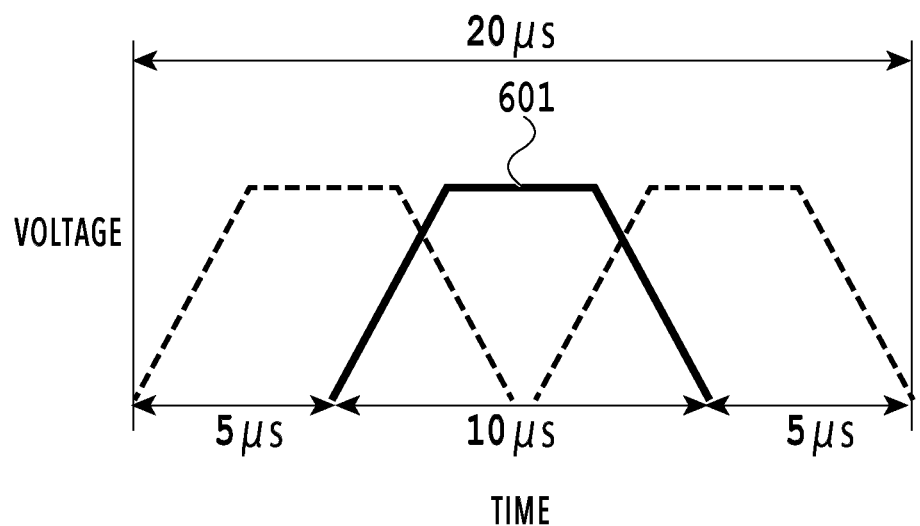
FIG. 6 is a diagram illustrating an example of a waveform of a voltage applied to a piezoelectric element.

FIG. 6 is a diagram illustrating an example of the waveform of the voltage applied to the piezoelectric element 18. As illustrated in FIG. 6, an ejection waveform 601 for the ejection is actually about 10 us. In a section of a time width of 20 us, the remaining 10 us is waiting time. That is, if the first waiting time is 5 us in the time width of 20 us, the waiting time after the ejection is 5 us. For instance, in a case where the ejection timing is set earlier by 2 us, the first waiting time is 3 us, and the waiting time after the ejection is 7 us.

In the case where the waveform is set in the center of the time width as described above, it is possible to adjust the ejection timing by $\pm(1/F \text{ [KHz]}-T \text{ [us]})/2$, where F [KHz] represents the ejection frequency, and T [us] represents the ejection waveform length.

With the above example used for description, it is possible to adjust the timing by ±5 us if the ejection frequency is 50 KHz and the ejection waveform length is 10 us. Additionally, it is possible to perform the correction of the landing position by ±5 um if the stage moving speed is 1 m/s and the ejection is performed every 20 us.

In a perspective of preventing the exuding of the ejection material 114 from the mesa 107a, it is required to allow the landing with an accuracy of ±10 um or less with respect to the predetermined distance L in this example. In this case, for example, if the ejection port 19 of the ejection unit 11 is contaminated, the ejection angle may deviate, and thus the landing position may deviate greatly. For this reason, there is required a method of correcting the ejection timing more greatly. The present embodiment uses the properties that the deviations in the ejection unit 11 due to the contamination of the ejection port 19 occur in the same direction in the ejection unit 11.

The contamination of the ejection port 19 is described. In a case of manufacturing inkjet chips to be used as the module substrate 57 of the ejection unit 11 by MEMS, the inkjet chips are processed in the unit of a wafer, and are cut out of the processed wafer. Since the processing is in the unit of a wafer, a distribution occurs in each single wafer. The ejection properties of each inkjet chip are determined depending on the position from which of the wafer the inkjet chip is cut out. In a case where the ejection port 19 is opened by etching, an etching residual may be left in the ejection port 19. The properties of the generation of the etching residual are also determined depending on the position in which the inkjet chip is cut out of the wafer. In other words, the contamination of the ejection port 19 in the inkjet chip occurs in similar positions. Accordingly, the deviations due to the contamination of the ejection port 19 occur in a similar direction in the single inkjet chip. Usually, the number of the nozzles in which the deviations due to the contamination of the nozzles 54 (ejection ports 19) occur is adjusted to be 10 or less nozzles by a shipping inspection.

Because of the above reasons, the deviations in the stage moving direction in the ejection unit 11 occur in the same direction with respect to the ejection from the normal nozzle. That is, if the ejection unit 11 includes multiple abnormal nozzles, the ejections from the abnormal nozzles deviate in the same directions. In the present embodiment, the phenomenon that the deviations in the ejection unit 11 occur in the same direction with respect to the ejection from the normal nozzle is used to increase the correctable range of the ejection timing.

Figure 7:
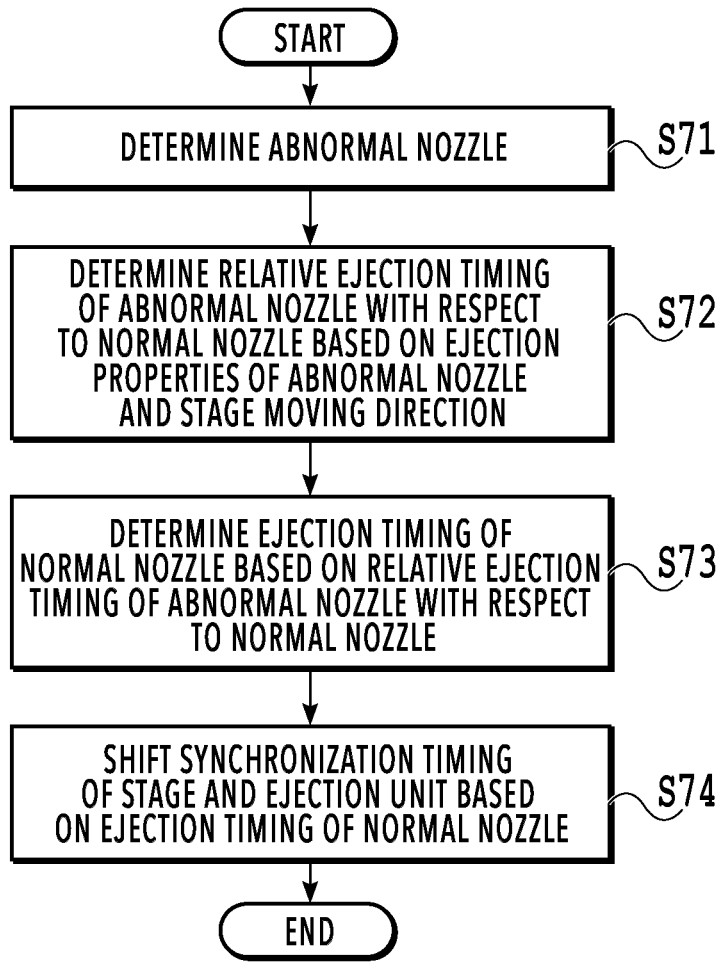
FIG. 7 is a flowchart indicating a correction operation.

FIG. 7 is a flowchart indicating the correction operation of the present embodiment. The correction operation of FIG. 7 is an operation executed by the control unit 106. More specifically, in the control unit 106, the CPU executes the processing indicated in FIG. 7 according to the control programs stored in the ROM. The correction operation indicated in FIG. 7 may be executed if the adjustment of the ejection position is instructed by the user or in a timing of predetermined maintenance.

In S71, the control unit 106 obtains ejection property information on the ejection properties of the nozzle 54 and determines an abnormal nozzle. The ejection properties indicate the ejection angle of the nozzle 54 or the deviation amount from the reference position of the ejection material 114 landing from the nozzle 54. For example, the deviation of the ejection angle of each nozzle 54 is measured before the ejection device 10 is mounted in the imprint apparatus 101, and the control unit 106 obtains the ejection property information by reading the data. Otherwise, the ejection material 114 may be ejected onto the substrate 111 on the imprint apparatus 101, and the deviation amount of the landing position of the ejection material 114 may be measured to allow the control unit 106 to obtain the ejection property information of each nozzle. Based on the obtained ejection property information, the control unit 106 determines a nozzle 54 in which the ejection angle or the deviation amount of the landing position deviates beyond a reference value as the abnormal nozzle.

In S72, based on the ejection properties of the nozzle determined as the abnormal nozzle in S71 and the data of the stage moving direction, the control unit 106 determines the relative ejection timing of the abnormal nozzle with respect to the normal nozzle. For example, in which direction of the stage moving direction the ejection timing of the abnormal nozzle with respect to the normal nozzle should be shifted and how much the ejection timing should be shifted are determined. That is, the relative ejection timing indicates the amount of the shift of either making earlier or later the ejection timing of the abnormal nozzle with respect to the normal nozzle.

Figure 8:
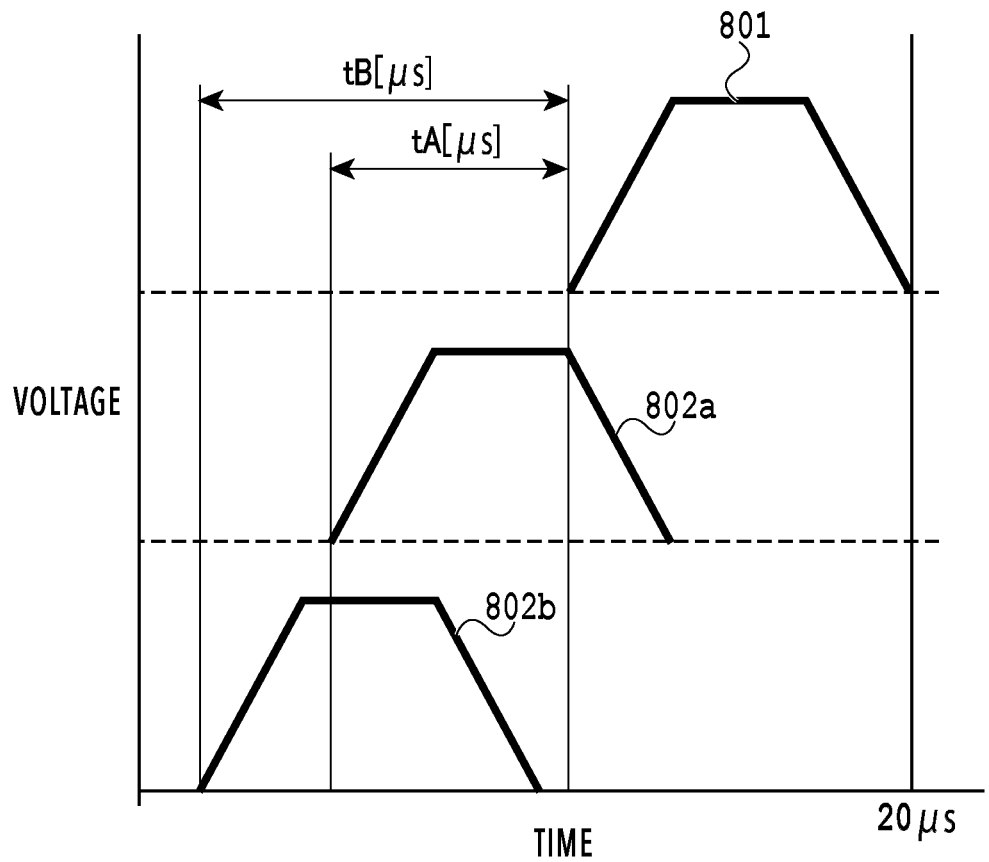
FIG. 8 is a diagram illustrating an example of determining a relative ejection timing of an abnormal nozzle with respect to a normal nozzle.

FIG. 8 is a diagram describing an example of determining the relative ejection timing of the abnormal nozzles with respect to the normal nozzle. For example, it is assumed that the abnormal nozzles have the ejection properties illustrated in FIG. 5A and respectively eject the ejection material 114a and 114b in FIG. 5B, and the stage moving direction is the direction illustrated in FIG. 5B. Additionally, it is assumed that the landing position of the ejection material 114a deviates rearward in the stage moving direction by tA [um], and the landing position of the ejection material 114b deviates rearward in the stage moving direction by tB [um]. If the stage moving speed is 1 [m/s], each ejection timing needs to be made earlier than the ejection from the normal nozzle by tA [um]/1 [m/s]=tA [us] or tB [um]/1 [m/s]=tB [us]. That is, the ejection timings of the abnormal nozzles are determined such that the ejection timings of the abnormal nozzles are earlier than the ejection timing of the normal nozzle by tA [us] and tB [us]. In this example, a relative relationship of the ejection timings between an ejection waveform 801 of the normal nozzle and ejection waveforms 802a and 802b of the abnormal nozzles is obtained as illustrated in FIG. 8.

In S73, based on the relative ejection timing of the abnormal nozzle with respect to the normal nozzle determined in S72, the control unit 106 determines the ejection timing of the normal nozzle. In S72, whether the ejection timing of the abnormal nozzle is before or after the ejection timing of the normal nozzle is determined. If the ejection timing of the abnormal nozzle is before the ejection timing of the normal nozzle in a predetermined time region as illustrated in FIG. 8 (if the ejection from the abnormal nozzle is performed first), the ejection timing of the normal nozzle is set such that the ejection timing of the normal nozzle is set to be the latest. To put in simply, a rear end of the ejection waveform 801 of the normal nozzle is set to be coincide with a rear end of the waveform time region comparable to the time width of 20 um as illustrated in FIG. 8. That is, the ejection waveform 801 of the normal nozzle is set such that the waiting time before the ejection is the longest. With this, it is possible to have a long time region in which the ejection timing of the abnormal nozzle can be adjusted. Consequently, it is possible to increase the adjustment range of the ejection timing of the abnormal nozzle.

For example, if the ejection is performed every 20 us and the ejection waveform is 10 us as illustrated in FIG. 8, it is possible to perform the correction with the landing accuracy of 10 um. That is, in the present embodiment, since the adjustment range of the ejection timing of the abnormal nozzle is 10 um, the adjustment range is greater than the case of 5 um described in the example in FIG. 6. If the ejection port 19 of the ejection unit 11 is contaminated, the ejection state may be varied as the state of the contamination is changed, and the landing position may deviate as well. With the adjustment range of the ejection timing set greater than a prescribed value as described above even in such a case with contamination, the correction of the landing position is easy even if the landing position is varied continuously.

If the ejection timing of the abnormal nozzle is after the ejection timing of the normal nozzle (that is, if the ejection from the normal nozzle is performed first), which is opposite of the above example, the ejection timing of the normal nozzle may be set such that the ejection timing of the normal nozzle becomes the earliest.

In S74, based on the ejection timing of the normal nozzle, the control unit 106 shifts the timing of synchronizing the substrate stage 104 and the ejection unit 11. For example, before the correction operation, the control unit 106 synchronizes the movement timing of the substrate stage 104 and the ejection timing of the ejection device 10 based on the position of the ejection waveform 601 in the center of the waveform time region as illustrated in FIG. 6. In this case, in the present embodiment, the ejection timing of the normal nozzle is changed in S73 by performing the correction operation. This causes the deviation of the landing position on the substrate 111 of the ejection material 114c ejected from the normal nozzle by the changed amount of the timing.

To deal with this, in S74, the synchronization timing of the substrate stage 104 and the ejection unit 11 is shifted by the shifted amount of the ejection timing of the normal nozzle to prevent the deviation of the landing position on the substrate 111 of the ejection material 114c ejected from the normal nozzle. Such adjustment of the synchronization timing may be performed by shifting the movement timing of the substrate stage, by shifting the timing of starting the ejection in the ejection unit 11, or by shifting both the timings.

It is possible to perform the correction of the landing position in which the great adjustment range is secured by performing the correction of the ejection timing by the correction operation as described above.

The deviation of the landing position of the ejection material described in FIG. 5B is an example of the case of the single ejection port row 19a. In the ejection unit 11 of the present embodiment, the ejection port rows 19a to 19d are arranged. In this case, even if there are multiple ejection port rows including the abnormal nozzles or even if there is an ejection port row including no abnormal nozzle, it is possible to properly correct the ejection timing by performing the processing according to the flowchart of FIG. 7.

For example, a specific description is given while assuming a case in which the ejection port rows 19a and 19b include the abnormal nozzles and the ejection port rows 19c and 19d include no abnormal nozzles. In S71, the determination on the abnormal nozzles is performed. Consequently, the abnormal nozzles included in the ejection port rows 19a and 19b are determined. As described above, the deviations due to the contamination occur in similar directions in the single inkjet chip. Accordingly, the directions in which the ejection timings of the abnormal nozzles are shifted with respect to the normal nozzle determined in S72 are common directions in both the cases where there are multiple abnormal nozzles included in single ejection port row and where multiple ejection port rows include the abnormal nozzles. Thus, the ejection timings of the normal nozzles determined in S73 are also common ejection timings in the ejection port rows 19a to 19d. For example, the ejection timings of the normal nozzles in the ejection port rows 19a to 19d are determined to be coincide with the rear end of the waveform time region. The ejection timings of the normal nozzles in the ejection port rows 19c and 19d including no abnormal nozzles are also determined to be coincide with the rear end of the waveform time region. Thereafter, in S74, the synchronization of the substrate stage 104 and the ejection unit 11 is shifted to properly adjust the ejection timings in the ejection port rows 19a and 19b including the abnormal nozzles and in the ejection port rows 19c and 19d including no abnormal nozzles.

The example in which the ejection timing of the normal nozzle is determined to be coincide with one end of the waveform time region is described above; however, the configuration is not limited thereto. The ejection timing of the normal nozzle may be determined to coincide with anywhere as long as the ejection timing of the normal nozzle coincides with a position near either side of the center of the waveform time region depending on the deviation direction of the abnormal nozzle.

<Ejection Timing During Reciprocation>

The example of performing the correction of the ejection timing in the case where the ejection operation is performed while the substrate stage 104 is moved in one direction is described above. Next, an example in which the ejection material 114 is ejected from the ejection unit 11 in both an outward route and a return route while the substrate stage 104 is reciprocated is described. In the case where the substrate stage 104 is reciprocated, the stage moving direction illustrated in FIG. 5B is opposite between the outward route and the return route. The stage moving direction in FIG. 5B is assumed to be in the outward route. In this case, in the outward route, the abnormal nozzle is delayed from the normal nozzle with respect to the stage moving direction. On the other hand, in the return route, the abnormal nozzle is advanced from the normal nozzle with respect to the stage moving direction.

Figure 9A:
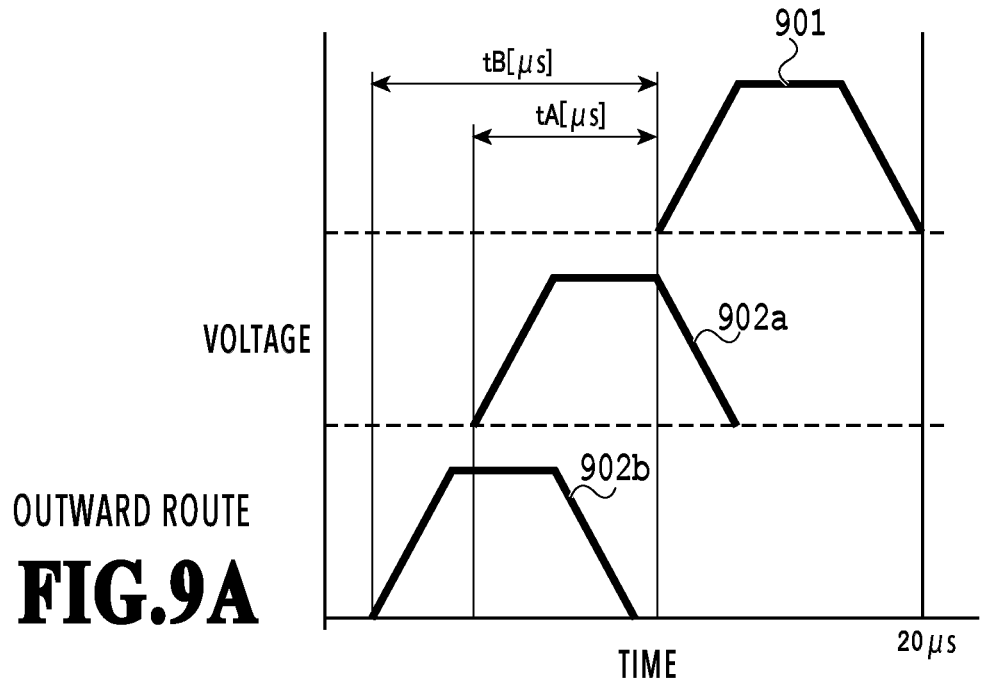
FIGS. 9A and 9B are diagrams describing an example in which ejection timings are different between an outward route and a return route.
Figure 9B:
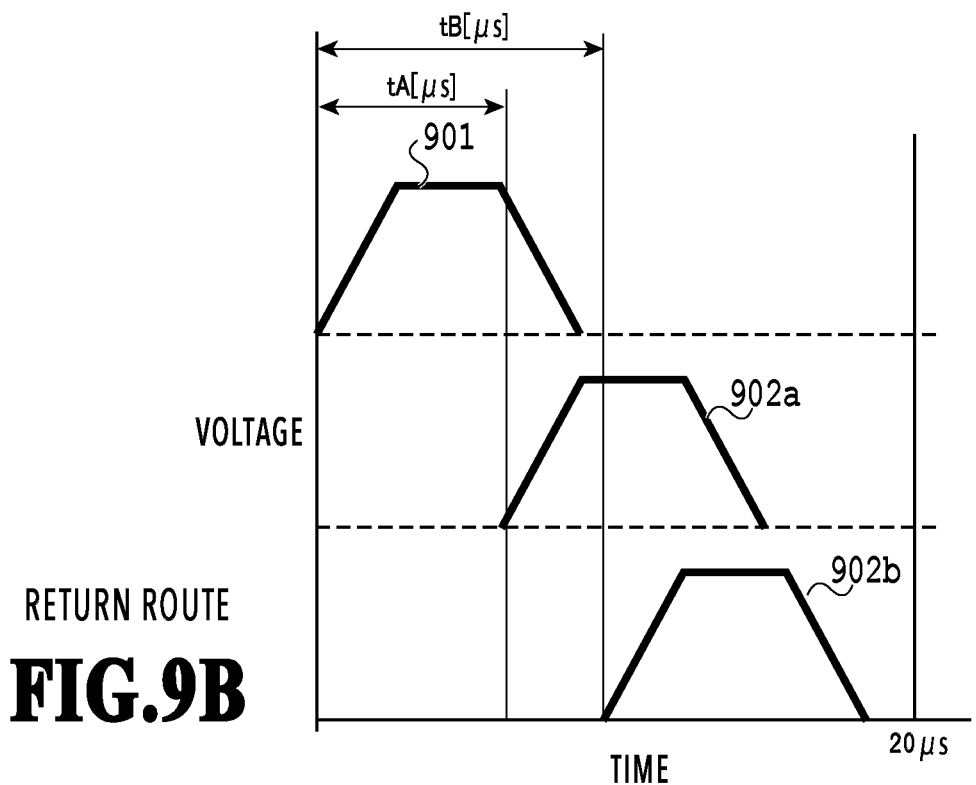

FIGS. 9A and 9B are diagrams describing an example in which the ejection timings are different between the outward route and the return route. FIG. 9A illustrates the ejection timings in the outward route, and FIG. 9B illustrates the ejection timings in the return route. FIG. 9A illustrates the ejection timings same as that in the example illustrated in FIG. 8. The relative relationship of the ejection timings between an ejection waveform 901 of the normal nozzle and ejection waveforms 902a and 902b of the abnormal nozzles is obtained as illustrated in FIGS. 9A and 9B. As illustrated in FIG. 9B, in the return route, the ejection timing of the normal nozzle is determined to be coincide with a leading end of the waveform time region. That is, in the return route, the ejection from the normal nozzle is performed first, and the ejection from the abnormal nozzle is performed after the ejection from the normal nozzle. The synchronization timing of the substrate stage 104 and the ejection unit 11 is adjusted also in the return route. Thus, even in the case where the ejection material 114 is ejected from the ejection unit 11 in both the routes in the reciprocation of the substrate stage 104, it is possible to properly correct the ejection timing. Additionally, it is possible to make the adjustment range of the ejection timing greater than the prescribed value.

FIGS. 10A to 10C are diagrams describing states during the reciprocation. FIG. 10A illustrates the ejection unit 11, the mold 107 held by the mold holding mechanism 103, and the substrate 111. The substrate 111 is held by the substrate stage 104 as illustrated in FIG. 1 and is moved as the substrate stage 104 is moved. The substrate 111 is capable of moving to an ejection position in which the ejection unit 11 operates and an imprint position in which the mold 107 operates. As illustrated in FIG. 10A, once the ejection by the ejection unit 11 is performed on a region 1 of the substrate 111, the substrate stage 104 is moved to the imprint position in which the region 1 on the substrate 111 is being imprinted by the mold 107. Once the imprint operation on the region 1 is performed, the substrate stage 104 is moved again, the ejection operation and the imprint operation are performed on the region 2, and then the ejection operation and the imprint operation are performed on the region 3. FIG. 10B is a plan view of the substrate 111 held by the substrate stage 104. As described in FIG. 10A, the ejection operation and the imprint operation are performed in the order from the region 1, the region 2, and the region 3 of the substrate 111. FIG. 10C is a diagram describing that the ejection on each region is completed by performing the ejection operation in each of the outward route and the return route. For example, once the ejection on the region 1 is performed by the ejection unit 11 while the substrate stage 104 is moved in the outward route direction, the substrate stage 104 is then shifted in the Y direction by half a pitch to move the substrate stage 104 in the return route direction. Then, the ejection unit 11 performs the ejection operation, and thus the ejection operation on the region 1 is completed. Thereafter, as illustrated in FIG. 10A, the imprint operation is performed on the region 1.

<Correction in Amount More Than Grid Size>

The correction of the landing position by shifting the ejection timing as described above is applicable for only the correction of the landing position within a predetermined distance (for example, 10 um) corresponding to a predetermined period of time in the waveform time region. If there is a deviation of the landing position by a predetermined distance or more in the stage moving direction, the landing position can be corrected by correcting the data (image data herein) indicating the ejection positions of the ejection material 114.

For example, it is assumed that there is an abnormal nozzle in which the landing position in the stage moving direction deviates by +50 um. Additionally, it is assumed that a grid size is 20 um. The grid is the minimum unit of the landing position. In this case, a correction image in which the ejection materials ejected from the abnormal nozzles all deviate to the negative side by two grids is created based on the image indicating the ejection positions of the ejection materials 114. In the correction image, an image portion indicating the ejection position of the ejection material 114 ejected from the normal nozzle is not changed from the original image. Once the ejection material 114 is ejected based on such a correction image, the landing position of the ejection material 114 ejected from the abnormal nozzle is corrected by −40 um, and the corrected position obtained is +50 um−40 um=+10 um from the landing position. In this state, it is possible to make adjustment by 10 um by further correcting the ejection timing as described above. Consequently, it is possible to achieve 0 um of the landing error of the abnormal nozzle.

As described above, it is possible to perform coarse adjustment in the grid size unit by correcting the image data depending on the ejection properties of the abnormal nozzle. Additionally, it is possible to perform fine adjustment of the landing position by further correcting the ejection timing. With this, it is possible to perform the correction of the landing position in the stage moving direction with high accuracy. Also, since the correctable range is increased by increasing the adjustment range of the ejection timing adjustment, it is possible to improve the landing accuracy of the ejection material 114. With this, it is possible to improve the yield of the semiconductor chip to be obtained from the substrate 111.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-165641, filed Sep. 11, 2019, which is hereby incorporated by reference wherein in its entirety.

What is claimed is:

1. An imprint apparatus, comprising:
   a substrate stage configured to move a substrate;
   an ejection unit including a plurality of nozzles and configured to eject an ejection material from the nozzles onto the substrate in synchronization with movement of the substrate stage;
   an imprint unit configured to press down a mold in which a pattern is formed onto the substrate on which the ejection material is ejected; and
   a control unit configured to cause the ejection unit to eject the ejection material in a time region having a predetermined period while synchronizing with the substrate stage,
   wherein in a case where the plurality of nozzles includes a first nozzle from which the ejection material lands on a predetermined position in a case where ejection is performed at a predetermined timing and a second nozzle from which the ejection material lands on a position deviated from the predetermined position in the case where ejection is performed at the predetermined timing, the control unit causes the first nozzle to eject at a later timing in the time region if the control unit causes the second nozzle to eject earlier than the first nozzle, and the control unit causes the first nozzle to eject at an earlier timing in the time region if the control unit causes the second nozzle to eject later than the first nozzle.

2. The imprint apparatus according to claim 1, further comprising a determination unit configured to determine a relative ejection timing the second nozzle with respect to the first nozzle based on ejection properties of the nozzles and a moving direction of the substrate stage,
   wherein the control unit controls synchronization timing of the substrate stage and the ejection unit based on the ejection timing of the first nozzle.

3. The imprint apparatus according to claim 2, wherein in a case where ejection properties of the second nozzle indicate an occurrence of a deviation in a landing position equal to or more than a predetermined distance corresponding to the time region, the determination unit performs the determination after making a correction on data indicating ejection positions of the ejection material such that the data indicating the ejection position of the ejection material from the second nozzle is shifted in a direction opposite to the deviation in the moving direction.

4. The imprint apparatus according to claim 2, wherein the ejection unit is configured to eject the ejection material in synchronization with the movement of the substrate stage in the moving direction in each of an outward route and a return route,
   wherein the determination unit determines the relative ejection timing in each of the outward route and the return route, and
   wherein the control unit controls the synchronization timing in the outward route and the synchronization timing in the return route.

5. The imprint apparatus according to claim 2, wherein a plurality of nozzle rows in which the plurality of nozzles are aligned in a second direction crossing the moving direction are arranged side by side in the moving direction in the ejection unit, and
   wherein the determination unit determines ejection timings of first nozzles in both a nozzle row including the second nozzle and a nozzle row including no second nozzle based on the determined relative ejection timing.

6. The imprint apparatus according to claim 2, wherein the determination unit determines the second nozzle based on the ejection properties of the nozzles.

7. The imprint apparatus according to claim 6, wherein the ejection properties of each of the nozzles indicate an ejection angle of the each of the nozzles or a deviation amount of the ejection material landing from the each of the nozzles from a reference position.

8. The imprint apparatus according to claim 7, wherein the determination unit determines a nozzle in which the ejection angle or the deviation amount deviates beyond a reference value as the second nozzle.

9. The imprint apparatus according to claim 1, wherein the nozzle includes a piezoelectric element,
   wherein the ejection unit is configured to apply a voltage to the piezoelectric element in the time region, and
   wherein the ejection timing of the first nozzle is the latest in the time region if the ejection timing of the second nozzle is earlier than the ejection timing of the first nozzle.

10. The imprint apparatus according to claim 1, wherein the nozzle includes a piezoelectric element,
    wherein the ejection unit is configured to apply a voltage to the piezoelectric element in the time region, and
    wherein the ejection timing of the first nozzle is the earliest in the time region if the ejection timing of the second nozzle is later than the ejection timing of the first nozzle.

11. The imprint apparatus according to claim 1, wherein the control unit is configured to control a synchronization timing of the ejection unit and the substrate stage such that a distance in a moving direction of the substrate stage from an edge to a predetermined region in which the mold is pressed down onto the substrate is set to a predetermined distance.

12. A method of controlling an imprint apparatus comprising:
    a substrate stage configured to move a substrate;
    an ejection unit including a plurality of nozzles and configured to eject an ejection material from the nozzles onto the substrate in synchronization with movement of the substrate stage;
    an imprint unit configured to press down a mold on which a pattern is formed onto the substrate on which the ejection material is ejected; and
    a control unit configured to cause the ejection unit to eject the ejection material in a time region having a predetermined period while synchronizing with the substrate stage, the method comprising causing the ejection unit to eject the ejection material in a time region having a predetermined period while synchronizing with the substrate stage, wherein in a case where the plurality of nozzles includes a first nozzle from which the ejection material lands on a predetermined position in a case where ejection is performed at a predetermined timing and a second nozzle from which the ejection material lands on a position deviated from the predetermined position in the case where ejection is performed at the predetermined timing, the control unit causes the first nozzle to eject at a later timing in the time region if the control unit causes the second nozzle to eject earlier than the first nozzle, and the control unit causes the first nozzle to eject at an earlier timing in the time region if the control unit causes the second nozzle to eject later than the first nozzle.

13. The method according to claim 12, wherein the imprint apparatus further comprises a determination unit configured to determine a relative ejection timing of the second nozzle with respect to the first nozzle based on ejection properties of the nozzles and a moving direction of the substrate stage, and wherein synchronization timing of the substrate stage and the ejection unit is controlled based on the ejection timing of the first nozzle.

* * * * *